(12) United States Patent
Miyoshi et al.

(10) Patent No.: US 8,860,084 B2
(45) Date of Patent: Oct. 14, 2014

(54) EPITAXIAL SUBSTRATE FOR SEMICONDUCTOR DEVICE, SEMICONDUCTOR DEVICE, METHOD OF MANUFACTURING EPITAXIAL SUBSTRATE FOR SEMICONDUCTOR DEVICE, AND METHOD OF MANUFACTURING SEMICONDUCTOR DEVICE

(71) Applicant: NGK Insulators, Ltd., Nagoya (JP)

(72) Inventors: Makoto Miyoshi, Inazawa (JP); Mikiya Ichimura, Ichinomiya (JP); Mitsuhiro Tanaka, Tsukuba (JP)

(73) Assignee: NGK Insulators, Ltd., Nagoya (JP)

( * ) Notice: Subject to any disclaimer, the term of this patent is extended or adjusted under 35 U.S.C. 154(b) by 6 days.

(21) Appl. No.: 13/772,704

(22) Filed: Feb. 21, 2013

(65) Prior Publication Data
US 2013/0168734 A1 Jul. 4, 2013

Related U.S. Application Data

(63) Continuation of application No. PCT/JP2011/068742, filed on Aug. 19, 2011.

(30) Foreign Application Priority Data

Aug. 25, 2010 (JP) ................. 2010-187899

(51) Int. Cl.
*H01L 21/00* (2006.01)
*H01L 29/66* (2006.01)
*H01L 29/778* (2006.01)
*H01L 21/02* (2006.01)
*H01L 29/20* (2006.01)

(52) U.S. Cl.
CPC ........... *H01L 29/778* (2013.01); *H01L 21/0262* (2013.01); *H01L 21/02378* (2013.01); *H01L 29/66431* (2013.01); *H01L 21/0254* (2013.01); *H01L 21/0237* (2013.01); *H01L 21/02458* (2013.01); *H01L 29/66462* (2013.01); *H01L 29/7787* (2013.01); *H01L 29/2003* (2013.01)
USPC ........................................... 257/190; 438/48

(58) Field of Classification Search
USPC .............................................. 257/190; 438/48
See application file for complete search history.

(56) References Cited

U.S. PATENT DOCUMENTS

2003/0020092 A1  1/2003 Parikh et al.
2006/0006414 A1  1/2006 Germain et al.
2011/0024795 A1  2/2011 Miyoshi et al.

FOREIGN PATENT DOCUMENTS

EP    1 612 866 A2    1/2006
EP    2 259 287 A1   12/2010
(Continued)

OTHER PUBLICATIONS

Kikkawa, Toshihide. "*Highly Reliable 250 W GaN High Electron Mobility Transistor Power Amplifier*," Japanese Journal of Applied Physics, vol. 44, No. 7A, 2005, pp. 4896-4901.

(Continued)

*Primary Examiner* — Douglas Menz
(74) *Attorney, Agent, or Firm* — Burr & Brown, PLLC (57) ABSTRACT

Provided is a semiconductor device of normally-off operation type having a low on-resistance. An epitaxial substrate for it includes: a base substrate; a channel layer made of a first group-III nitride having a composition of $In_{x1}Al_{y1}Ga_{z1}N$ at least containing Al and Ga and x1=0 and 0≤y1≤0.3; and a barrier layer made of a second group-III nitride having a composition of $In_{x2}Al_{y2}Ga_{z2}N$ at least containing In and Al. The composition of the second group-III nitride is, in a ternary phase diagram for InN, AlN, and GaN, in a certain range that is determined in accordance with the composition of the first group-III nitride. The barrier layer has a thickness of 3 nm or less. A low-crystallinity insulating layer is further formed on the barrier layer. The low-crystallinity insulating layer is made of silicon nitride and has a thickness of 3 nm or less.

18 Claims, 4 Drawing Sheets

(56) References Cited

FOREIGN PATENT DOCUMENTS

| JP | 2006-24927 | | 1/2006 |
|---|---|---|---|
| JP | 2008-084942 | A1 | 4/2008 |
| JP | 2009-302370 | | 12/2009 |
| JP | 2010-45343 | | 2/2010 |
| WO | 03/032397 | A2 | 4/2003 |
| WO | 2009/119357 | A1 | 10/2009 |

OTHER PUBLICATIONS

Keller et al. "*Gallium Nitride Based High Power Heterojunction Field Effect Transistors: Process Development and Present Status at UCSB*," IEEE Transactions on Electron Devices, vol. 48, No. 3, Mar. 2001, pp. 552-559.

Medjdoub et al. "*Can InAlN/GaN be an alternative to high power/high temperature AlGaN/GaN devices?*" IEEE IEDM Tech. Digest in IEEE IEDM 2006, pp. 673-676.

Endoh et al. "Non-Recessed-Gate Enhancement-Mode AlGaN/GaN High Electron Mobility Transistors with High RF Performance," Japanese Journal of Applied Physics, vol. 43, No. 414, 2004, pp. 2255-2258.

Saito et al. "*Recessed-Gate Structure Approach Toward Normally Off High-Voltage AlGaN/GaN HEMT for Power Electronics Applications*," IEEE Transactions on Electron Devices, vol. 53, No. 2, Feb. 2006, pp. 356-362.

Kanamura et al. "*Enhancement-Mode GaN MIS-HEMTs With n-GaN/i-AlN/n-GaN Triple Cap Layer and High-κ Gate Dielectrics*," IEEE Electron Device Lett., 31, 2010, pp. 189-191.

Ota et al., "*A Normally-off GaN FET with High Threshold Voltage Uniformity Using a Novel Piezo Neutralization Technique*," IEEE IEDM2009 Tech. Digest, pp. 1-4.

Kambayashi et al. "*Over 100 A Operation Normally-off AlGaN/GaN hybrid MOS-HFET on Si Substrate with high-breakdown voltage*," Solid-State Electronics 54, 2010, pp. 660-664.

Extended European Search Report (Application No. 11819859.7) dated Jul. 18, 2014.

▲ : InN/MO MOLE FLOW RATIO=0.8
(TMA/MO MOLE FLOW RATIO=0)

◆ : InN/MO MOLE FLOW RATIO=0.5
(TMA/MO MOLE FLOW RATIO=0)

□ : InN/MO MOLE FLOW RATIO=0.80
(TMA/MO MOLE FLOW RATIO=0.18)

○ : InN/MO MOLE FLOW RATIO=0.6
(TMA/MO MOLE FLOW RATIO=0.3)

EPITAXIAL SUBSTRATE FOR SEMICONDUCTOR DEVICE, SEMICONDUCTOR DEVICE, METHOD OF MANUFACTURING EPITAXIAL SUBSTRATE FOR SEMICONDUCTOR DEVICE, AND METHOD OF MANUFACTURING SEMICONDUCTOR DEVICE

TECHNICAL FIELD

The present invention relates to an epitaxial substrate having a multilayer structure made of a group-III nitride semiconductor, and particularly to an epitaxial substrate having a multilayer structure for use in a semiconductor device, to a method of manufacturing it, and to the semiconductor device.

BACKGROUND ART

A group-III nitride semiconductor is attracting attention as a semiconductor material for a next-generation high-frequency/high-power device, because the nitride semiconductor has a high breakdown electric field and a high saturation electron velocity. For example, an HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as silicon and SiC, is used as a base substrate of an HEMT-device substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

In order to put into practical use the HEMT device or the HEMT-device substrate that is a multilayer structure used for preparation of the HEMT device, various problems have to be solved including problems concerning improvement of the performance such as increasing the power density and efficiency, problems concerning improvement of the functionality such as a normally-off operation, fundamental problems concerning a high reliability and a price reduction, and the like. Active efforts are made on each of the problems.

For example, it is known that, in a case where a nitride HEMT device has the most general configuration in which a channel layer is made of GaN and a barrier layer is made of AlGaN, the concentration of a two-dimensional electron gas existing in an HEMT-device substrate increases as the AlN mole fraction in AlGaN of the barrier layer increases (for example, see Non-Patent Document 2). If the concentration of the two-dimensional electron gas can be considerably increased, the controllable current density of the HEMT device, that is, the power density that can be handled, would be considerably improved.

Also attracting attention is an HEMT device having a structure with reduced strain, such as an HEMT device in which a channel layer is made of GaN and a barrier layer is made of InAlN, in which the dependence on a piezo polarization effect is small and almost only a spontaneous polarization is used to generate a two-dimensional electron gas with a high concentration (for example, see Non-Patent Document 3).

As for the normally-off operation, from the viewpoint of fail-safe, it is generally desirable that an electronic device, and particularly a power semiconductor device that handles a power control, performs a normally-off operation, that is, an operation that blocks conduction when no electrical signal is not inputted from the outside. On the other hand, an HEMT device made of a group-III nitride semiconductor is a device that uses a two-dimensional electron gas generated at a hetero interface as described above. Therefore, in an normally-on operation rather than the normally-off operation, the HEMT device originally exerts excellent conduction characteristics, that is, a low on-resistance. As a method for achieving the normally-off operation of the HEMT device made of a group-III nitride semiconductor, the following methods are known.

As for a nitride HEMT device of Schottky gate structure type including a channel layer made of GaN and a barrier layer made of AlGaN, for example, there are known: (1) a method in which the thickness of AlGaN barrier layer is reduced so that a gate threshold voltage (hereinafter, also referred to simply as a threshold voltage) is shifted in a positive direction, and thereby the normally-off is achieved (for example, see Non-Patent Document 4); and (2) a method in which recess etching is performed only in a portion immediately below a gate electrode (for example, see Non-Patent Document 5).

Alternatively, there are also known (3) a method in which, instead of a Schottky junction, a MIS (metal-insulator-semiconductor) structure with interposition of an insulating layer is adopted in an HEMT device of recess gate structure type (for example, see Non-Patent Document 6 and Non-Patent Document 7); and (4) a method in which an HEMT device having an inverted channel structure is prepared using an MIS gate structure (for example, see Non-Patent Document 8).

Moreover, there is also known (5) a method in which a channel layer is made of AlGaN whose Al mole fraction in all the group-III elements is 0.3 while a barrier layer is made of InAlGaN whose composition is in a predetermined composition range, to thereby achieve an HEMT device having a two-dimensional electron gas concentration of $2 \times 10^{13}/cm^2$ or higher and capable of the normally-off operation (for example, see Patent Document 1).

The above-described methods for achieving the normally-off operation in the HEMT device, except the method (5), involves problems that a manufacturing process is troublesome and that a sufficiently-low on-resistance is not obtained.

For example, in a case of the method (1), the reduction in the thickness of the barrier layer lowers the two-dimensional electron gas concentration. As a result, a low on-resistance, which is the original feature of the nitride HEMT device, cannot be obtained. The reason therefor is considered as follows. As the thickness of the barrier layer decreases, the distance between a channel portion and a surface of the barrier layer decreases. As a result, the potential of a surface level contributes to generation of electric charges, or a piezo polarization effect is reduced.

In the method (2), the adding of recess processing makes the process troublesome. To ensure the reproducibility in a device manufacturing process (to enable a device having a certain quality to be stably manufactured), a high accuracy of the recess processing is demanded.

The methods (1) and (2) are directed to an HEMT device of Schottky gate structure type, in which an upper limit of a positive voltage that can be applied to the gate electrode is determined by the height of a Schottky barrier. When a gate positive voltage is set to be about 1.5V or more, it is difficult to ensure a large drain current while suppressing a gate leakage current. On the other hand, the HEMT device has a feature that, when the HEMT device is designed to have a wide range of gate voltage application, a drain current thereof is increased. For example, in a case where the threshold voltage is −3V, the gate voltage range spans 4.5V, that is, from −3V to about +1.5V. However, in a case of the HEMT device designed such that the threshold voltage thereof is a positive value (>0V) by reducing the thickness of its barrier layer, the gate voltage range spans, at most, about 1.5V. In this case, while a maximum drain current (on-current) of the former is about 0.8 A/mm, that of the latter is about 0.4 A/mm or less. Such a reduction in an on-current is more noticeable as the shift of the threshold voltage to the positive side is larger. Accordingly, when the normally-off operation is performed in a nitride HEMT device having a Schottky gate, a problem arises that a wide gate voltage range is not ensured and therefore a large drain current does not flow (the on-resistance cannot be lowered), resulting in a failure to obtain good conduction characteristics.

In the method (3), the recess processing and the insulating film formation process are added, which makes the process troublesome. To ensure the reproducibility in a device manufacturing process (to enable a device having a certain quality to be stably manufactured), a high accuracy of the recess processing is demanded.

The method (4) requires the step of forming the MIS gate structure. Moreover, the electron mobility in the inverted MIS channel structure is low, namely, 200 cm²/Vs or less. Therefore, even when the normally-off operation is achieved, the performance of the HEMT device itself is degraded.

PRIOR-ART DOCUMENTS

Patent Documents

Patent Document 1: International Patent Publication No. 2009/119357

Non-Patent Documents

Non-Patent Document 1: "Highly Reliable 250 W High Electron Mobility Transistor Power Amplifier", TOSHIHIDE KIKKAWA, Jpn. J. Appl. Phys. 44, (2005), pp. 4896-4901.

Non-Patent Document 2: "Gallium Nitride Based High Power Heterojuncion Field Effect Transistors: process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48, (2001), pp. 552-559.

Non-Patent Document 3: "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, pp. 673-676.

Non-Patent Document 4: "Non-Recessed-Gate Enhancement-Mode AlGaN/GaN High Electron Mobility Transistors with High RF Performance", Akira ENDOH, Yoshimi YAMASHITA, Keiji IKEDA, Masataka HIGASHIWAKI, Kohki HIKOSAKA, Toshiaki MATSUI, Satoshi HIYAMIZU and Takachi MIMURA, Japanese Journal of Applied Physics Vol. 43, No. 4B, 2004, pp. 2255-2258.

Non-Patent Document 5: "Recessed-Gate Structure Approach Toward Normally Off High-Voltage AlGaN/GaN HEMT for Power Electronics Applications", Wataru Saito, Yoshiharu Takada, Masahiko Kuraguchi, Kunio Tsuda, and Ichiro Omura, IEEE Trans. Electron Devices, 53, (2006), pp. 356-362.

Non-Patent Document 6: "Enhancement-Mode GaN MIS-HEMTs With n-GaN/i-AlN/n-GaN Triple Cap Layer and High-κ Gate Dielectrics", Masahiro Kanamura, Toshihiro Ohki, Toshihide Kikkawa, Kenji Imanishi, Tadahiro Imada, Atsushi Yamada, and Naoki Hara, IEEE Electron Device Lett., 31, (2010), pp. 189-191.

Non-Patent Document 7: "A Normally-off GaN FET with High Threshold Voltage Uniformity Using A Novel Piezo Neutralization Technique", K. Ota, K. Endo, Y. Okamoto, Y. Ando, H. Miyamoto, and H. Shimawaki, IEEE IEDM2009 Tech. Digest, pp. 1-4.

Non-Patent Document 8: "Over 100 A Operation normally-off AlGaN/GaN hybrid MOS-HFET on Si substrate with high-breakdown voltage", Hiroshi Kambayashi, Yoshihiro Satoh, Shinya Oomoto, Takuya Kokawa, Takehiro Nomura, Sadahiro Kato, Tat-sing Pawl Chow, Solid-State Electronics 54, (2010), pp. 660-664.

SUMMARY OF THE INVENTION

The present invention has been made in view of the problems described above, and an object of the present invention is to provide a semiconductor device of normally-off operation type having a low on-resistance, and to provide a method for preparing the semiconductor device without any complicated step.

To solve the problems described above, in a first aspect of the present invention, an epitaxial substrate for semiconductor device includes: a base substrate; a channel layer made of a first group-III nitride having a composition of $In_{x1}Al_{y1}Ga_{z1}N$ (x1+y1+z1=1) that contains at least Al and Ga; and a barrier layer made of a second group-III nitride having a composition of $In_{x2}Al_{y2}Ga_{z2}N$ (x2+y2+z2=1) that contains at least In and Al. The composition of the first group-III nitride is in a range determined by x1=0 and 0≤y1≤0.3. The composition of the second group-III nitride is, in a ternary phase diagram for InN, AlN, and GaN, in a range that is enclosed by straight lines represented by the following expressions and that is determined in accordance with the composition of the first group-III nitride. The barrier layer has a thickness of 3 nm or less. A low-crystallinity insulating layer is formed on the barrier layer, the low-crystallinity insulating layer being made of silicon nitride and having a thickness of 3 nm or less.

$$x2 = \frac{y2 - (0.27 + 0.5yl)}{1.78} = -\frac{z2 - (0.73 - 0.5yl)}{2.78}$$

$$x2 = \frac{y2 - (0.4 + 0.6yl)}{1.78} = -\frac{z2 - (0.6 - 0.6yl)}{2.78}$$

$$z2 = 0.4$$

$$z2 = 0$$

In a second aspect of the present invention, the epitaxial substrate for semiconductor device according to the first aspect further includes a sub insulating layer provided between the barrier layer and the low-crystallinity insulating layer, the sub insulating layer being made of a group-III nitride with insulating properties and having a thickness of 2.5 nm or less.

In a third aspect of the present invention, in the epitaxial substrate for semiconductor device according to the second aspect, the sub insulating layer is made of AlN.

In a fourth aspect of the present invention, the epitaxial substrate for semiconductor device according to any of the first or second aspect further includes a spacer layer provided between the channel layer and the barrier layer, the spacer layer being made of a third group-III nitride having a composition of $In_{x3}Al_{y3}Ga_{z3}N$ (x3+y3+z3=1) that contains at least Al and that has higher band gap energy than that of the barrier layer. A total thickness of the spacer layer and the barrier layer is 5 nm or less.

In a fifth aspect of the present invention, in the epitaxial substrate for semiconductor device according to the fourth aspect, the spacer layer is made of AlN.

In a sixth aspect of the present invention, a semiconductor device includes: a base substrate; a channel layer made of a first group-III nitride having a composition of $In_{x1}Al_{y1}Ga_{z1}N$ (x1+y1+z1=1) that contains at least Al and Ga; and a barrier layer made of a second group-III nitride having a composition of $In_{x2}Al_{y2}Ga_{z2}N$ (x2+y2+z2=1) that contains at least In and Al. The composition of the first group-III nitride is in a range determined by x1=0 and 0≤y1≤0.3. The composition of the second group -III nitride is, in a ternary phase diagram for InN, AlN, and GaN, in a range that is enclosed by straight lines represented by the following expressions and that is determined in accordance with the composition of the first group-III nitride. The barrier layer has a thickness of 3 nm or less. A low-crystallinity insulating layer is formed on the barrier layer, the low-crystallinity insulating layer being made of silicon nitride and having a thickness of 3 nm or less. A source electrode and a drain electrode are formed on the low-crystallinity insulating layer with an ohmic junction and a gate electrode is formed on the low-crystallinity insulating layer with a Schottky junction.

$$x2 = \frac{y2-(0.27+0.5yl)}{1.78} = -\frac{z2-(0.73-0.5yl)}{2.78}$$

$$x2 = \frac{y2-(0.4+0.6yl)}{1.78} = -\frac{z2-(0.6-0.6yl)}{2.78}$$

z2=0.4 z2=0

In a seventh aspect of the present invention, a method of manufacturing an epitaxial substrate for semiconductor device includes: a channel layer formation step of epitaxially forming a channel layer on a base substrate, the channel layer being made of a first group-III nitride having a composition of $In_{x1}Al_{y1}Ga_{z1}N$ (x1+y1+z1=1) that contains at least Al and Ga; a barrier layer formation step of epitaxially forming a barrier layer on the channel layer, the barrier layer being made of a second group-III nitride having a composition of $In_{x2}Al_{y2}Ga_{z2}N$ (x2+y2+z2=1) that contains at least In and Al; and a main insulating layer formation step of forming a main insulating layer on the barrier layer, the main insulating layer being made of silicon nitride. In the channel layer formation step, the composition of the first group-III nitride is selected from a range determined by x1=0 and 0≤y1≤0.3. In the barrier layer formation step: the composition of the second group-III nitride is selected from a range that is enclosed by straight lines represented by the following expressions and that is determined in accordance with the composition of the first group-III nitride in a ternary phase diagram for InN, AlN, and GaN; and the barrier layer is formed with a thickness of 3 nm or less. In the main insulating layer formation step, the main insulating layer is formed with a thickness of 3 nm or less at a formation temperature of 750° C. or more and 850° C. or less.

$$x2 = \frac{y2-(0.27+0.5yl)}{1.78} = -\frac{z2-(0.73-0.5yl)}{2.78}$$

$$x2 = \frac{y2-(0.4+0.6yl)}{1.78} = -\frac{z2-(0.6-0.6yl)}{2.78}$$

z2=0.4 z2=0

In an eighth aspect of the present invention, the method of manufacturing an epitaxial substrate for semiconductor device according to the seventh aspect further includes a sub insulating layer formation step of forming a sub insulating layer on the barrier layer, the sub insulating layer being made of a group-III nitride with insulating properties and having a thickness of 2.5 nm or less. The main insulating layer is formed on the sub insulating layer.

In a ninth aspect of the present invention, in the method of manufacturing an epitaxial substrate for semiconductor device according to the eighth aspect, the sub insulating layer is made of AlN.

In a tenth aspect of the present invention, the method of manufacturing an epitaxial substrate for semiconductor device according to the seventh or eighth aspect further includes a spacer layer formation step of forming a spacer layer on the channel layer, the spacer layer being made of a third group-III nitride having a composition of $In_{x3}Al_{y3}Ga_{z3}N$ (x3+y3+z3=1) that contains at least Al and that has higher band gap energy than that of the barrier layer. The barrier layer is formed on the spacer layer.

In an eleventh aspect of the present invention, in the method of manufacturing an epitaxial substrate for semiconductor device according to the tenth aspect, the spacer layer is made of AlN.

In a twelfth aspect of the present invention, in the method of manufacturing an epitaxial substrate for semiconductor device according to the seventh or eighth aspect: a temperature T1(° C.) at which the channel layer is formed is determined within a range of 950° C.≤T1≤1250° C.; and a temperature T2(° C.) at which the barrier layer is formed is determined within a range of 800−667·x2(° C.)≤T2≤860−667·x2(° C.) and 600° C.≤T2≤850° C., the range being determined in accordance with an InN mole fraction x2 in the second group-ill nitride.

In a thirteenth aspect of the present invention, a method of manufacturing a semiconductor device includes the steps of: preparing an epitaxial substrate through the method of manufacturing an epitaxial substrate for semiconductor device according to any of claims 7 to 12; forming a source electrode and a drain electrode on the main insulating layer of the epitaxial substrate, with an ohmic junction; performing a heat treatment on the epitaxial substrate having the source electrode and the drain electrode formed thereon; and forming a gate electrode on the main insulating layer, with a Schottky junction.

In the first, fifth, and seventh to twelfth aspects of the present invention, an epitaxial substrate having a high two-dimensional electron concentration and a low sheet resistance is achieved. Forming a semiconductor device by using such an epitaxial substrate achieves a semiconductor device of normally-off operation type having a low on-resistance in which a gate threshold voltage has a positive value and an upper limit of a gate voltage is high.

Particularly, in the second, third, eighth, and ninth aspects, a semiconductor device of normally-off operation type in which a gate leakage current is further reduced is achieved.

Particularly, in the fourth, fifth, tenth, and eleventh aspects, a semiconductor device of normally-off operation type in which the mobility of a two-dimensional electron gas is high is achieved.

Particularly, in the twelfth aspect, by determining the temperature at which the barrier layer is formed in accordance with a target composition of the barrier layer, the barrier layer having such a target composition can be surely formed.

In the sixth and thirteenth aspects, the semiconductor device can be prepared by using an epitaxial substrate having a high two-dimensional electron concentration and a low sheet resistance. Accordingly, a semiconductor device of normally-off operation type having a low on-resistance in which a gate threshold voltage has a positive value and an upper limit of a gate voltage is high can be achieved without performing a troublesome step of forming a recess gate structure.

EMBODIMENT FOR CARRYING OUT THE INVENTION

Figure 1:
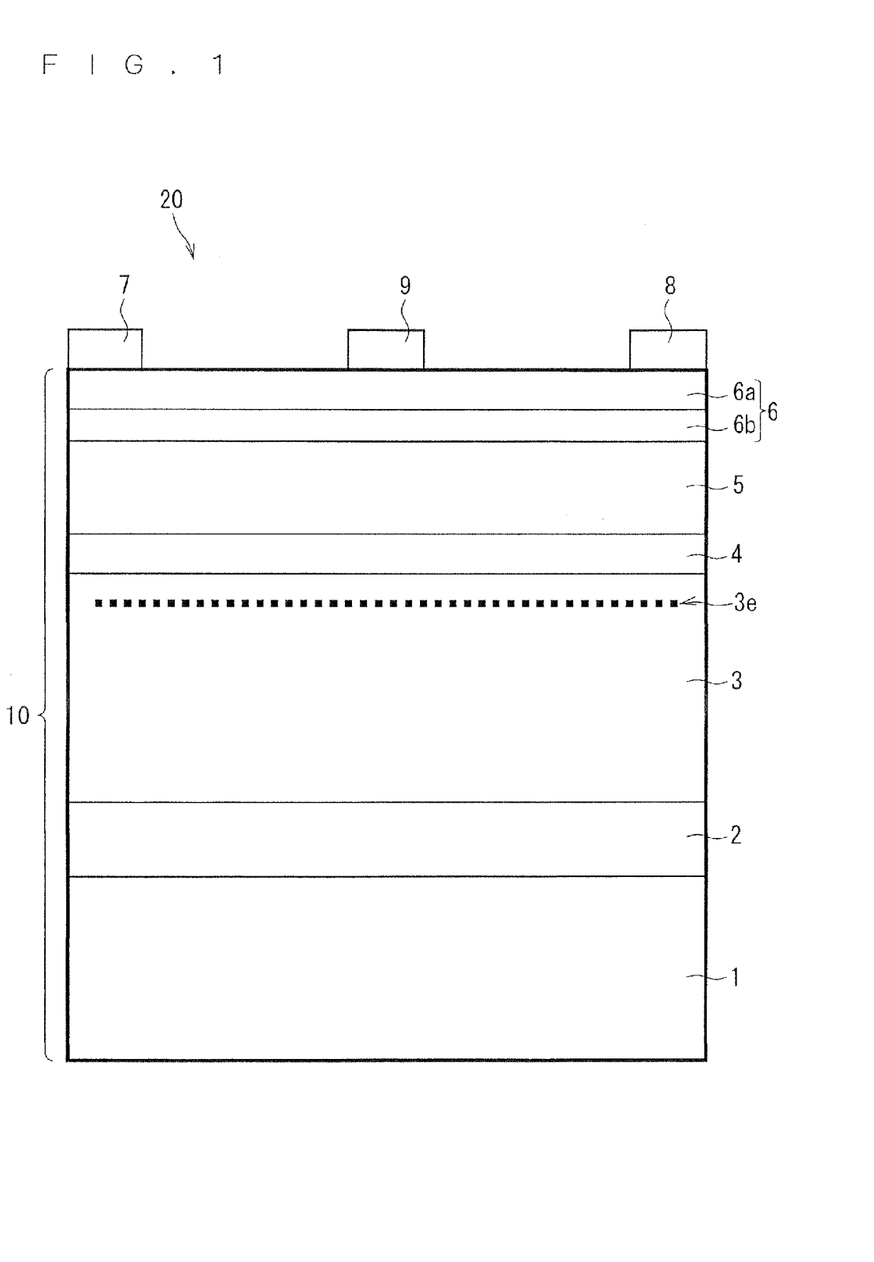
FIG. 1 A schematic cross-sectional view showing an outline configuration of an HEMT device 20 that is one aspect of a semiconductor device according to an embodiment of the present invention.

<Configuration of HEMT Device>
FIG. 1 is a schematic cross-sectional view showing an outline configuration of an HEMT device 20 that is one aspect of a semiconductor device according to an embodiment of the present invention. Roughly, the HEMT device 20 has a configuration in which a source electrode 7, a drain electrode 8, and a gate electrode 9 are arranged on an epitaxial substrate 10. More specifically, the epitaxial substrate 10 has a configuration in which a base substrate 1, a buffer layer 2, a channel layer 3, a spacer layer 4, and a barrier layer 5 are laminated such that a (0001) crystal plane is substantially in parallel with a substrate surface. Additionally, an insulating layer 6 is formed on the barrier layer 5. In the HEMT device 20, the source electrode 7, the drain electrode 8, and the gate electrode 9 are formed on the insulating layer 6 of the epitaxial substrate 10. The thickness ratio among the layers shown in FIG. 1 does not reflect the actual ratio. In one preferred example, all of the buffer layer 2, the channel layer 3, the spacer layer 4, the barrier layer 5, and the insulating layer 6 are epitaxially formed through a MOCVD process (Metal Organic Chemical Vapor Deposition) (details will be described later).

The following description is directed to a case where the MOCVD process is used for the formation of each layer. However, a method appropriately selected from other epitaxial growth processes including vapor deposition processes and liquid phase deposition processes such as MBE, HVPE, and LPE may be adopted, or different growth processes may be adopted in combination, as long as the method can form each of the layers with good crystallinity.

No particular limitation is put on the base substrate 1, as long as the base substrate 1 allows a nitride semiconductor layer with good crystallinity to be formed thereon. In one preferable example, a single crystal 6H—SiC substrate is used. However, a substrate made of sapphire, Si, GaAs, spinel, MgO, ZnO, ferrite, or the like, may be adopted.

The buffer layer 2 is a layer made of AlN, and formed with a thickness of about several hundreds of nm, for the purpose of obtaining good crystal quality of the channel layer 3, the spacer layer 4, the barrier layer 5, and the insulating layer 6 which will be formed on the buffer layer 2. In one preferable example, the buffer layer 2 is formed with a thickness of 200 nm.

The channel layer 3 is a layer made of a group-III nitride having a composition of $In_{x1}Al_{y1}Ga_{z1}N$ ($x1+y1+z1=1$), and formed with a thickness of about several µm. In this embodiment, the channel layer 3 is formed such that its composition range satisfies $x1=0$ and $0 \le y1 \le 0.3$. In a case of $0.3 \le y1 \le 1$, the crystallinity of the channel layer 3 itself is significantly degraded, which makes it difficult to obtain an epitaxial substrate 10, and thus an HEMT device 20, having good electrical characteristics.

On the other hand, the barrier layer 5 is a layer made of a group-III nitride having a composition of $In_{x2}Al_{y2}Ga_{z2}N$ (here, $x2+y2+z2=1$), and formed with a thickness of 3 nm or less. The composition of the barrier layer 5 is selected from a predetermined composition range in a ternary phase diagram for three components of InN, AlN, and GaN, as will be described later.

Moreover, the spacer layer 4 is provided between the channel layer 3 and the barrier layer 5. The spacer layer 4 is a layer made of a group-III nitride having a composition of $In_{x3}Al_{y3}Ga_{z3}N$ ($x3+y3+z3=1$), containing at least Al (that satisfies $y3>0$), and having a band gap larger than the band gap of the barrier layer 5. The spacer layer 4 is formed with a thickness of 0.5 nm to 1.5 nm. Preferably, the spacer layer 4 is formed so as to satisfy $x3=0$ and $0 \le z3 \le 0.05$. In such a case, an alloy scattering effect is suppressed, and the concentration and the mobility of a two-dimensional electron gas are improved. More preferably, the spacer layer 4 is made of AlN.

In the epitaxial substrate 10 having such a layer configuration, a two-dimensional electron gas region $3e$, in which the two-dimensional electron gas exists with a high concentration, is formed at an interface between the channel layer 3 and the spacer layer 4 (more specifically, in a portion of the channel layer 3 near this interface).

However, it is not essential that the spacer layer 4 is provided in the epitaxial substrate 10. It may be also acceptable that the barrier layer 5 is formed directly on the channel layer 3. In this case, the two-dimensional electron gas region 3e is formed at an interface between the channel layer 3 and the barrier layer 5.

In order to successfully generate the two-dimensional electron gas in the two-dimensional electron gas region 3e, an interface between the channel layer 3 and the spacer layer 4 immediately above the channel layer 3 or an interface between the channel layer 3 and the barrier layer 5 is formed such that the mean roughness of the interface is in the range from 0.1 nm to 3 nm. Additionally, a surface of the spacer layer 4 or the barrier layer 5 is formed such that the mean square roughness of the surface is in the range from 0.1 nm to 3 nm. Although it may be also acceptable to form a flat interface beyond the above-mentioned range, this is not practical from the viewpoint of costs, the production yield, and the like. Preferably, the above-mentioned mean roughness is in the range from 0.1 nm to 1 nm and the above-mentioned mean square roughness is in the range from 0.1 nm to 1 nm. In such a case, an effect of confinement of the two-dimensional electron gas is further enhanced, to generate the two-dimensional electron gas with a higher concentration.

The insulating layer 6 is a layer provided for the purpose of improving the characteristics of the epitaxial substrate 10 and the HEMT device 20. The insulating layer 6 includes a main insulating layer 6a serving as an uppermost layer of the epitaxial substrate 10, and a sub insulating layer 6b interposed between the barrier layer 5 and the main insulating layer 6a.

The main insulating layer 6a is a layer made of silicon nitride (such as SiN), and formed with a thickness of 3 nm or less. The main insulating layer 6a is formed as a layer having a lower crystallinity than that of the ordinary insulating layer. This is achieved by, for example, setting a formation temperature at which the main insulating layer 6a is formed (in a case where the MOCVD process is adopted, the temperature of a susceptor of an MOCVD apparatus mentioned above) to be 750° C. to 850° C., which is lower than an ordinary formation temperature (about 1000° C. to 1200° C.) adopted in a case where a silicon nitride layer is provided as the insulating layer. The main insulating layer 6a formed in this manner will be also referred to as a low-crystallinity insulating layer. Forming the low-crystallinity insulating layer as the main insulating layer 6a exerts an effect in suppression of a contact resistance of the HEMT device 20. Details thereof will be described later.

The sub insulating layer 6b is a layer made of a group-III nitride having insulating properties, and formed with a thickness of 2.5 nm or less. The sub insulating layer 6b is laminated such that a (0001) crystal plane of the barrier layer 5 is substantially in parallel with the substrate surface. Preferably, the sub insulating layer 6b is made of AlN, and formed with a thickness of 2 nm or less. However, it is not essential that the sub insulating layer 6b is provided in the epitaxial substrate 10. It may be also acceptable that only the main insulating layer 6a is formed as the insulating layer 6 on the barrier layer 5.

Each of the source electrode 7 and the drain electrode 8 is a multilayer metal electrode whose metal layer has a thickness of about more than ten nm to one hundred and several tens of nm. Each of the source electrode 7 and the drain electrode 8 has an ohmic contact with the insulating layer 6. The source electrode 7 and the drain electrode 8 may be formed of a metal material that provides a good ohmic contact relative to the epitaxial substrate 10 (relative to the insulating layer 6). It is preferable that multilayer metal electrodes made of Ti/Al/Ni/Au are formed as the source electrode 7 and the drain electrode 8. However, this is not limiting. For example, a multilayer metal electrode made of Ti/Al/Pt/Au or Ti/Al may be formed. The formation of the source electrode 7 and the drain electrode 8 can be implemented through a photolithography process and a vacuum vapor deposition process.

On the other hand, the gate electrode 9 is a single-layer or multilayer metal electrode in which one or more metal layers are formed with a thickness of more than ten nm to one hundred and several tens of nm. The gate electrode 9 has a Schottky contact with the barrier layer 5 with interposition of the insulating layer 6. It is preferable that the gate electrode 9 is made of as a material, a metal having a high work function, such as Pd, Pt, Ni, and Au. Alternatively, it may be possible to form, as the gate electrode 9, a multilayer metal film consisted of some of the above-mentioned metals or concisted of some of the metals and Al, for example. The formation of the gate electrode 9 can be implemented through a photolithography process and a vacuum vapor deposition process.

Since the insulating layer 6 is interposed between the gate electrode 9 and the barrier layer 5, the HEMT device 20 can be considered as having an MIS gate structure.

<Relationship Between Device Characteristics and Compositions of Channel Layer and Barrier Layer>

In this embodiment, as disclosed in Patent Document 1, the composition of the barrier layer 5 is selected from a range that is enclosed by four straight lines represented by the following expressions in a ternary phase diagram for three components of InN, AlN, and GaN. Thereby, a two-dimensional electron gas concentration in the two-dimensional electron gas region 3e of the epitaxial substrate 10 is $2\times10^{13}/cm^2$ or more, and a threshold voltage of the HEMT device 20 is more than 0V. Thus, satisfying this composition range enables a high two-dimensional electron gas concentration to be maintained and the HEMT device 20 capable of a normally-off operation to be achieved.

$$x2 = \frac{y2 - (0.27 + 0.5yl)}{1.78} = -\frac{z2 - (0.73 - 0.5yl)}{2.78} \quad (1)$$

$$x2 = \frac{y2 - (0.4 + 0.6yl)}{1.78} = -\frac{z2 - (0.6 - 0.6yl)}{2.78} \quad (2)$$

$$z2=0.4 \quad (3)$$

$$z2=0 \quad (4)$$

The expressions (1) and (2) contain, as a variable, the composition of the channel layer 3 (to be specific, the value of y1 in a case of x1=0). This means that the composition of the barrier layer 5 that allows achievement of both a high two-dimensional electron gas concentration of $2\times10^{13}/cm^2$ or more and a threshold voltage more than 0V is determined in accordance with the composition of the channel layer 3.

In FIGS. 2, 3, 4, and 5, the composition range of the barrier layer 5 indicated by the expressions (1) to (4) is shown on ternary phase diagrams for three components of InN, AlN, and GaN. In each of the FIGS, the composition of the channel layer 3 is as follows.

Figure 2:
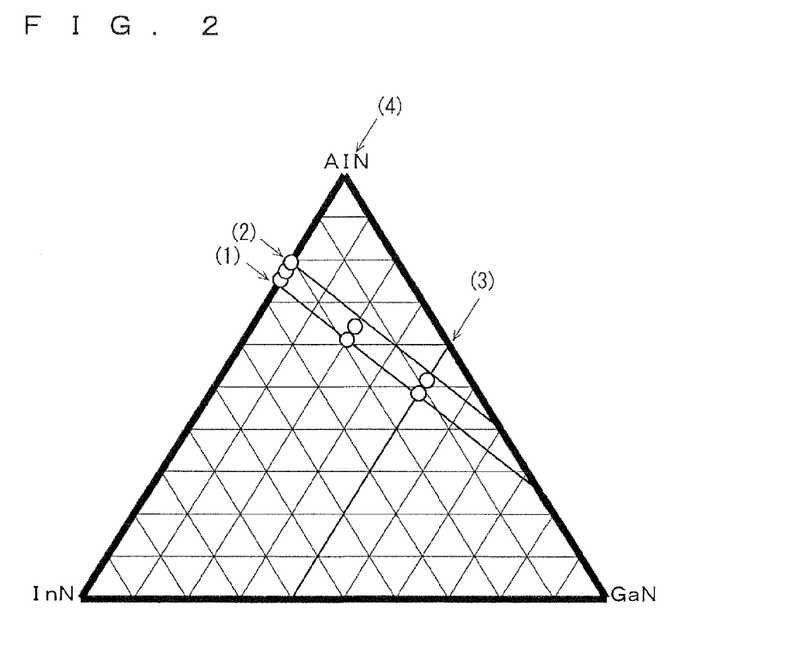
FIG. 2 A ternary phase diagram showing a composition range of a barrier layer 5 in a case where a channel layer is made of GaN.
Figure 3:
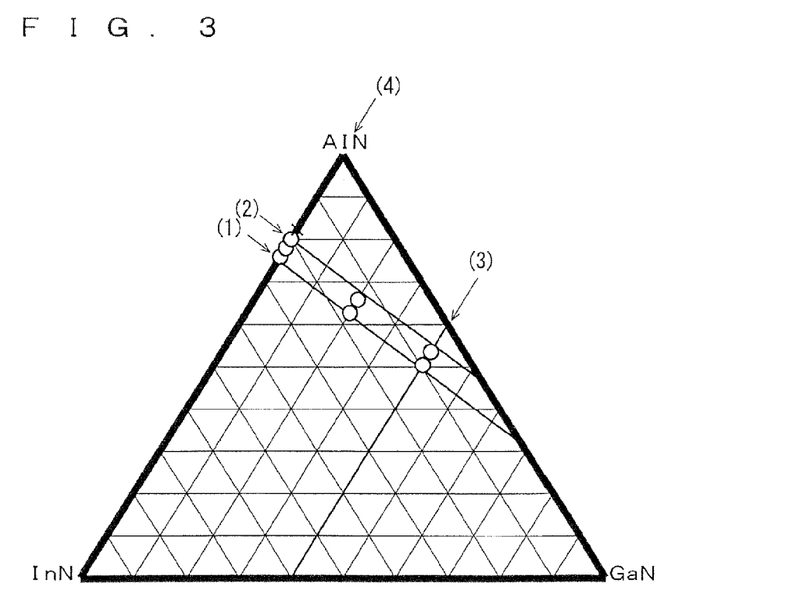
FIG. 3 A ternary phase diagram showing a composition range of the barrier layer 5 in a case where the channel layer is made of $Al_{0.1}Ga_{0.9}N$.
Figure 4:
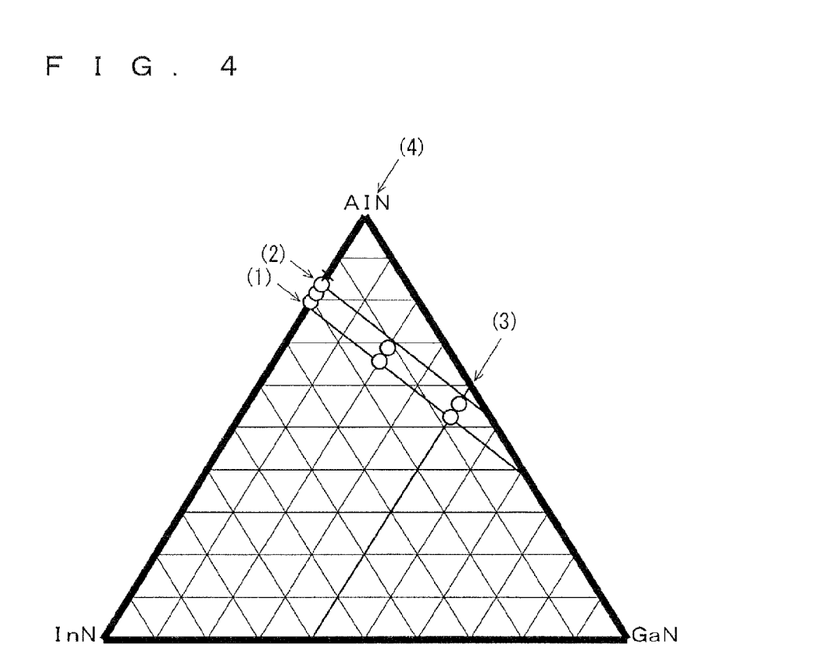
FIG. 4 A ternary phase diagram showing a composition range of the barrier layer 5 in a case where the channel layer is made of $Al_{0.2}Ga_{0.8}N$.
Figure 5:
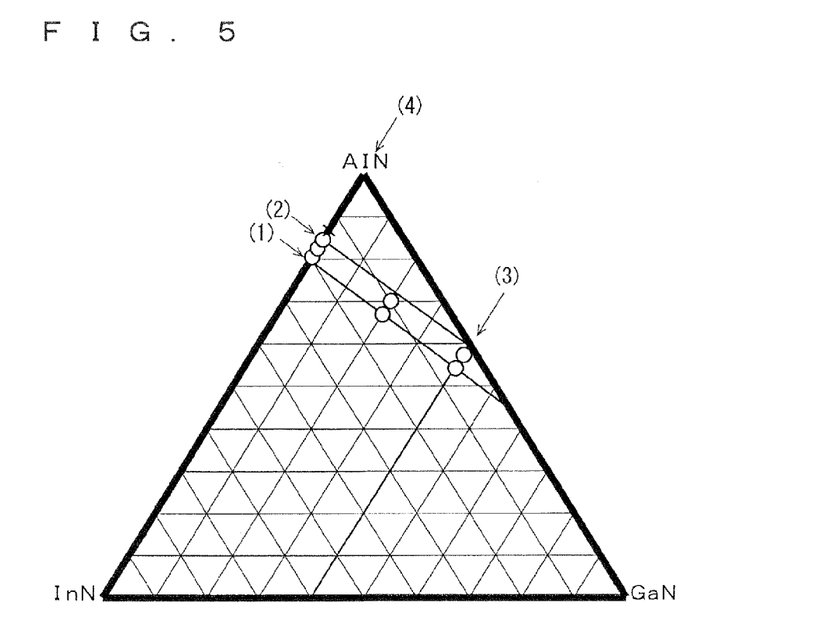
FIG. 5 A ternary phase diagram showing a composition range of the barrier layer 5 in a case where the channel layer is made of $Al_{0.3}Ga_{0.7}N$.

FIG. 2: GaN (x1=y1=0, z=1);
FIG. 3: $Al_{0.1}Ga_{0.9}N$ (x1=0, y1=0.1, z1=0.9);
FIG. 4: $Al_{0.2}Ga_{0.8}N$ (x1=0, y1=0.2, z1=0.8);
FIG. 5: $Al_{0.3}Ga_{0.7}N$ (x1=0, y1=0.3, z1=0.7).

Setting the composition ranges of the channel layer 3 and the barrier layer 5 in the above-described manner does not exclude that the channel layer 3 and the barrier layer 5 contain impurities. For example, the channel layer 3 and the barrier layer 5 may contain oxygen atoms within a concentration range from 0.0005 at % ($1\times10^{17}$/cm$^3$) or more to 0.05 at % ($1\times10^{19}$/cm$^3$) or less, or may contain carbon atoms within a concentration range from 0.0010 at % ($2\times10^{17}$/cm$^3$) or more to 0.05 at % ($1\times10^{19}$/cm$^3$) or less. Although the concentrations of oxygen atoms and carbon atoms may be below their respective lower limit values within the aforementioned ranges, this is not practical from the viewpoint of costs, the production yield, and the like. On the other hand, the concentrations of oxygen atoms and carbon atoms exceeding their respective upper limit values within the aforementioned ranges are not preferable, because the crystallinity of each layer is degraded to an extent that causes degradation of device characteristics.

<Spacer Layer>

The spacer layer 4 is a layer provided for the purpose of enhancing the effect of confinement of the two-dimensional electron gas in the two-dimensional electron gas region 3e. In a case where the spacer layer 4 is provided, the mobility of the two-dimensional electron gas in the HEMT device 20 is improved. For example, the HEMT device 20 not including the spacer layer 4 has a mobility of about 300 to 400 cm$^2$/Vs, while the HEMT device 20 including the spacer layer 4 has a mobility of about 1000 to 1400 cm$^2$/Vs.

However, when the spacer layer 4 is formed with a thickness smaller than 0.5 nm, the formation is the layer is insufficient, and thus the effect of confinement of the two-dimensional electron gas is not sufficiently obtained. On the other hand, when the spacer layer 4 is formed with a thickness greater than 1.5 nm, the film quality of the spacer layer 4 itself is degraded due to an internal stress, and thus sufficient improvement in the mobility cannot be expected.

When the channel layer 3 contains oxygen atoms or nitrogen atoms within the above-mentioned concentration range, the spacer layer 4 also contains them with the same concentration range.

<Method of Manufacturing Epitaxial Substrate and HEMT Device>

Next, a description will be given to a method for preparing the epitaxial substrate 10 and the HEMT device 20 having the above-described configuration.

In the following, a case where many HEMT devices 20 are simultaneously prepared from one base substrate 1 (a case of producing a large number of devices) will be described.

The preparation of the epitaxial substrate 10 can be performed by using a known MOCVD apparatus. More specifically, an MOCVD apparatus is used that is configured to feed, into a reactor, a source gas (TMI, TMA, TMG) of an organic metal (MO) of In, Al, Ga, a silane gas that is a source gas of Si, an ammonia gas, a hydrogen gas, and a nitrogen gas.

Firstly, for example, a (0001)-oriented 6H—SiC substrate having a diameter of two inches is prepared as the base substrate 1, and this base substrate 1 is placed on a susceptor provided in a reactor of the MOCVD apparatus. The inside of the reactor is vacuumed, and then, an atmosphere in a hydrogen/nitrogen mixed flow state is created while a pressure inside the reactor is kept at a predetermined value in the range from 5 kPa to 50 kPa. In this condition, the susceptor is heated to thereby raise the temperature of the substrate.

When the temperature of the susceptor reaches a predetermined temperature in the range from 950° C. to 1250° C. (for example, 1050° C.), which is a buffer layer formation temperature, an Al source gas and a NH$_3$ gas are introduced into the reactor, and thereby an AlN layer serving as the buffer layer 2 is formed.

After the formation of the AlN layer, the temperature of the susceptor is kept at a predetermined channel layer formation temperature T1(° C.), and a metal organic source gas and an ammonia gas are introduced into the reactor in accordance with the composition of the channel layer 3, and thereby an $In_{x1}Al_{y1}Ga_{z1}N$ layer ($x1=0$, $0 \leq y1 \leq 0.3$) serving as the channel layer 3 is formed. Here, the channel layer formation temperature T1 is a value determined in a temperature range of 950° C.$\leq$T1$\leq$1250° C. in accordance with a value of an AlN mole fraction y1 in the channel layer 3. No particular limitation is put on the pressure in the reactor at a time when the channel layer 3 is formed. A pressure can be appropriately selected from the range from 10 kPa to an atmospheric pressure (100 kPa).

After the formation of the $In_{x1}Al_{y1}Ga_{z1}N$ layer, a nitrogen gas atmosphere inside the reactor is maintained while the temperature of the susceptor is kept. The pressure in the reactor is set to be 10 kPa, and then a metal organic source gas and an ammonia gas are introduced into the reactor, so that an $In_{x3}Al_{y3}Ga_{z3}N$ layer serving as the spacer layer 4 is formed with a predetermined thickness.

As will be described later, when the barrier layer 5 is formed, the temperature of the susceptor is set to be 800° C. or less. Therefore, it is necessary to lower the temperature of the susceptor after the formation of the spacer layer 4. In a case where no spacer layer 4 is provided, the surface of the channel layer 3 is exposed during the lowering of the temperature, which may cause the surface to be etched by an atmosphere gas. On the other hand, in a case where the spacer layer 4 is formed at a temperature substantially equal to the channel layer formation temperature T1, the temperature of the susceptor is lowered after the formation of the spacer layer 4. As a result, the spacer layer 4 acts as a protection layer that protects the surface of the channel layer 3. This would also contribute to improvement in the mobility of the two-dimensional electron gas.

After the formation of the $In_{x3}Al_{y3}Ga_{z3}N$ layer, the temperature of the susceptor is kept at a predetermined barrier layer formation temperature T2(° C.), and a nitrogen gas atmosphere is created within the reactor. At this time, the pressure inside the reactor is kept at a predetermined value (for example, 10 kPa) in the range from 1 kPa to 30 kPa. Here, setting the pressure inside the reactor to be a predetermined value in the range from 1 kPa to 20 kPa achieves an HEMT device 20 having a low ohmic contact resistance and a less gate leakage current (having good Schottky contact characteristics). This effect derives from the fact that lowering the pressure in the reactor increases the surface flatness of the barrier layer 5.

Then, an ammonia gas and a metal organic source gas with a flow ratio in accordance with the composition of the barrier layer 5 are introduced into the reactor such that the so-called V/III ratio has a predetermined value of 3000 or more and 20000 or less is obtained. Thus, an $In_{x2}Al_{y2}Ga_{z2}N$ layer serving as the barrier layer 5 is formed with a predetermined thickness. The $In_{x2}Al_{y2}Ga_{z2}N$ layer is formed so as to having a composition that satisfies the expressions (1) to (4). A preferable range of the rate of growth of the barrier layer 5 is 0.01 to 0.1 μm/h.

In a case where the V/III ratio is a predetermined value in the range from 3000 or more to 7500 or less, the formation is made such that the interface between the channel layer 3 and the barrier layer 5 has a mean roughness in the range from 0.1 nm to 1 nm and the surface of the barrier layer 5 has a mean square roughness in the range from 0.1 nm to nm in a field of view of 5 μm×5 μm.

Here, the barrier layer formation temperature T2 is in the range from 650° C. or more to 800° C. or less, and in a temperature range of 800−667·x2(° C.)$\leq$T2$\leq$860−667·x2(°

C.), which is determined in accordance with an InN mole fraction x2 in the barrier layer 5.

Figure 6:
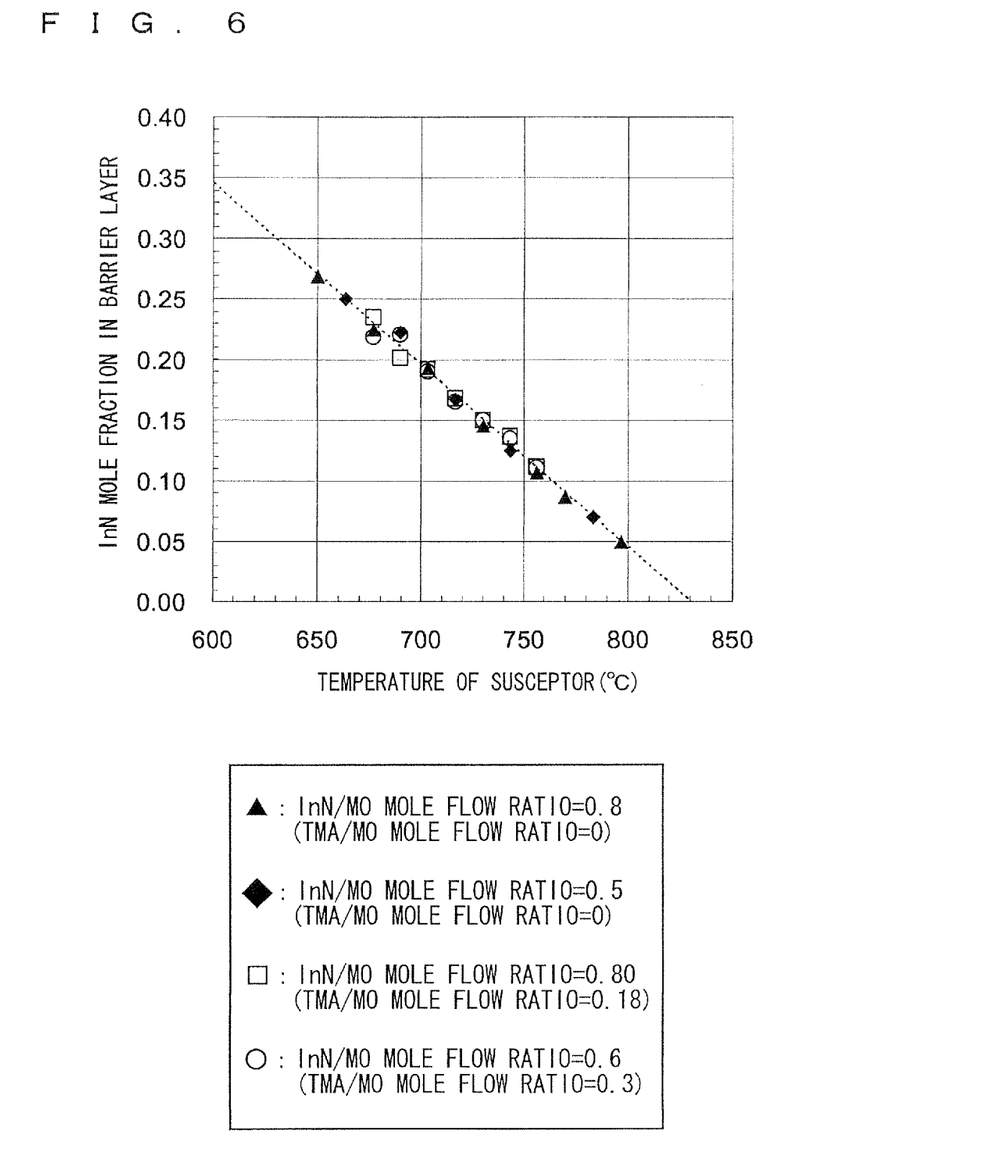
FIG. 6 A diagram for explaining a method for setting a temperature range of a barrier layer formation temperature T2.

FIG. 6 is a diagram for explaining that the barrier layer formation temperature T2 is determined in the above-mentioned temperature range. That is, FIG. 6 is a diagram plotting the InN mole fraction x2 in the barrier layer 5 against the temperature of the susceptor, in a case where a ratio (hereinafter, In flow ratio) of the flow rate of the In source gas to the flow rate of the entire metal organic source gas is varied within the range from 0.5 or more to 0.8 or less, and the temperature of the susceptor (corresponding to the barrier layer formation temperature T2) at a time when the barrier layer 5 is formed is varied. The V/III ratio is set to be 5000.

FIG. 6 reveals that data points are positioned on substantially the same straight line irrespective of the In flow ratio. This indicates that there is substantially a linear function relationship between the barrier layer formation temperature T2 and the InN mole fraction x2. Since there is no dependence on the In flow ratio, it is concluded that the InN mole fraction of the barrier layer is controllable by the barrier layer formation temperature T2 (the temperature of the susceptor) according to the above-mentioned functional relationship. That is, the barrier layer 5 having an aimed composition can be formed.

More specifically, from a state of arrangement of the data points in FIG. 6, a regression line represented by the following expression is derived.

$$T2 = 830 - 667 \cdot x2$$

Accordingly, in principle, if a desired InN mole fraction x2 is determined, the barrier layer formation temperature T2 can be determined from the above expression. Even in consideration of a variation caused by a difference among individual MOCVD apparatuses or individual heating members used for heating, the barrier layer 5 having a desired InN mole fraction x2 can be formed without fail by selecting a suitable temperature in a range of ±30° C. from the above expression. That is, when the relationship of $800 - 667 \cdot x2$ (° C.) $\leq T2 \leq 860 - 667 \cdot x2$ (° C.) is satisfied, the barrier layer 5 can be formed so as to have excellent controllability in a wide composition range, for example, in the composition range determined by the above-mentioned expressions (1) to (4).

Moreover, in this embodiment, for the preparation of the barrier layer 5, a nitrogen gas is used for all of a bubbling gas of a metal organic source and a carrier gas. That is, an atmosphere gas other than the source gas is only the nitrogen gas. Accordingly, the hydrogen-terminated dangling bond can be made nitrogen-terminated, and an electron structure of the barrier layer 5 is maintained in an ideal state, with the result that the generation of the two-dimensional electron gas in the two-dimensional electron gas region 3e is achieved with a high concentration. Note that it is not preferable to intentionally mix a hydrogen gas into the atmosphere during the preparation of the barrier layer 5, because this causes a reduction in the two-dimensional electron gas concentration.

After the formation of the $In_{x2}Al_{y2}Ga_{z2}N$ layer, then the temperature of the susceptor is set to be a predetermined sub insulating layer formation temperature. In this condition, an Al source gas and a $NH_3$ gas are introduced into the reactor, and thereby an AlN layer serving as the sub insulating layer 6b is formed with a predetermined thickness.

After the formation of the AlN layer, then the temperature of the susceptor is set to be a main insulating layer formation temperature that is 750° C. or more and 850° C. or less (for example, 800° C.). In this condition, a silane gas and a $NH_3$ gas are introduced into the reactor, and thereby a silicon nitride layer serving as the main insulating layer 6a is formed with a predetermined thickness.

Here, as described above, the main insulating layer formation temperature is set lower than an ordinary formation temperature that is adopted in a case where a silicon nitride layer is provided as an insulating layer. Forming the main insulating layer 6a at a temperature higher than 850° C. is not preferable, because this increases a contact resistance of the HEMT device 20. On the other hand, setting the main insulating layer formation temperature to be below 750° C. is not preferable, because this makes it difficult to form the main insulating layer 6a itself through a MOCVD process.

Upon the formation of the main insulating layer 6a, the preparation of the epitaxial substrate 10 is completed. After the epitaxial substrate 10 is obtained, this is used to prepare the HEMT device 20. Subsequent steps are achieved through a known method.

Firstly, a device isolation step is performed for etching and removing portions that will be boundaries between individual devices through a photolithography process and an RIE process into a depth of about 400 nm. This device isolation step is a step necessary for obtaining a large number of HEMT devices 20 from one epitaxial substrate 10, and essentially not necessary for the present invention.

After the device isolation step is performed, a $SiO_2$ film having a predetermined thickness (for example, 10 nm) is formed on the epitaxial substrate 10. Then, through a photolithography process, the $SiO_2$ film only in expected formation positions where the source electrode 7 and the drain electrode 8 are to be formed is removed by etching. Thereby, a $SiO_2$ pattern layer is formed.

After the formation of the $SiO_2$ pattern layer, through a vacuum vapor deposition process and a photolithography process, the source electrode 7 and the drain electrode 8 made of Ti/Al/Ni/Au are formed at their expected formation positions. Then, a heat treatment is performed for several tens of seconds (for example, 30 seconds) in the nitrogen gas atmosphere at a predetermined temperature (for example, 800° C.) in the range from 650° C. to 1000° C. As a result of this heat treatment, metal elements of the electrodes are alloyed, and diffused to transmit through the main insulating layer 6a. This ensures suitable ohmic characteristics of the source electrode 7 and the drain electrode 8 relative to the barrier layer 5.

After the heat treatment, the $SiO_2$ film in an expected formation position where the gate electrode 9 is to be formed is removed from the $SiO_2$ pattern layer through a photolithography process. Then, through a vacuum vapor deposition process and a photolithography process, the gate electrode 9 made of Ni/Au is formed in this expected formation position. The gate electrode 9 is formed as a Schottky metal pattern.

Then, through a photolithography process, the remaining portion of the $SiO_2$ pattern layer is removed. Then, a resultant is singulated into chips each having a predetermined size. Thereby, a large number of HEMT devices 20 are obtained. On the HEMT device 20 thus obtained, die bonding and wire bonding are performed as appropriate.

It may be possible that, prior to making the chips, the HEMT device 20 thus obtained is subjected to a heat treatment for the purpose of improving a mechanical strength of a bonding portion between the gate electrode 9 and the epitaxial substrate 10 (for the purpose of preventing peeling of the gate electrode 9). In one preferred example, this heat treatment is performed by holding the HEMT device 20 for several tens of seconds in a nitrogen gas atmosphere at a predetermined temperature in the range from 500° C. to 900° C.

<Features of Epitaxial Substrate and HEMT Device>

Next, features of the epitaxial substrate 10 and the HEMT device 20 having the above-described configuration will be described.

Firstly, the epitaxial substrate 10 according to this embodiment, in which the compositions of the channel layer 3 and the barrier layer 5 are determined in the above-mentioned composition ranges, is structured such that it is less influenced by a surface level and such that a spontaneous polarization effect makes more contribution than a piezo effect. Moreover, the inventors has confirmed that, as compared with a structure (AlGaN/GaN structure) in which the channel layer 3 is made of GaN and the barrier layer is made of AlGaN, a high two-dimensional electron gas concentration is maintained and a sheet resistance is kept low, even when the thickness of the barrier layer is reduced.

Additionally, in the epitaxial substrate 10, the main insulating layer 6a is formed in the above-described manner, and therefore a surface level is controlled. This exerts effects that a high two-dimensional electron gas concentration is maintained and the sheet resistance is further reduced. For example, in the epitaxial substrate 10, the sheet resistance is reduced down to about ½, as compared with a case where no main insulating layer 6a is provided.

It is generally considered that a substrate having a high two-dimensional electron gas concentration and a low resistance is not suited for an HEMT device of normally-off operation type. However, in the epitaxial substrate 10 according to this embodiment, both the thickness of the barrier layer 5 and the thickness of the main insulating layer 6a are 3 nm or less, but nevertheless a high two-dimensional electron gas concentration and a low sheet resistance are maintained. Therefore, in the HEMT device 20 prepared by using the epitaxial substrate 10, a normally-off state is achieved only by a built-in potential of a portion corresponding to the gate electrode 9. The following fact also contributes to the achievement of the normally-off state. That is, the main insulating layer 6a made of silicon nitride is bonded to the barrier layer 5 with a sufficiently small thickness made of a group-III nitride having a composition of $In_{x2}Al_{y2}Ga_{z2}N$, so that a conduction band edge of the barrier layer 5 is, throughout the entire film thickness thereof, pushed up toward a high energy side.

There is a tendency that increasing the thickness of the main insulating layer 6a reduces a threshold voltage. When the thickness is greater than 3 nm, the threshold voltage is negative, so that the normally-off operation is not achieved.

As described above, in this embodiment, the main insulating layer 6a is formed as a layer with a low crystallinity. This exerts an effect that, in the heat treatment performed after the formation of the pattern of the source electrode 7 and the drain electrode 8, the diffusion and transmission of metal elements of these electrodes in the main insulating layer 6a is suitably provoked. In the HEMT device 20, even though the source electrode 7 and the drain electrode 8 are formed on the main insulating layer 6a, the ohmic characteristics of these electrodes are sufficiently ensured. As a result, the contact resistance is suppressed. For example, a contact resistance of an epitaxial substrate whose main insulating layer 6a is formed at 900° C. is two orders higher than the contact resistance of the epitaxial substrate 10 according to this embodiment whose main insulating layer 6a is formed at a temperature in the range from 750° C. to 850° C.

Providing the sub insulating layer 6b in addition to the main insulating layer 6a exerts an effect that the gate leakage current is reduced in the HEMT device 20. However, a thickness equal to or greater than 3 nm is not preferable, because it causes the threshold voltage to be negative, thus failing to achieve the normally-off operation, and it also increases the contact resistance.

The HEMT device 20 according to this embodiment has the MIS gate structure. This can ensure a higher upper limit of a gate voltage range, as compared with a HEMT device of Schottky type in which an upper limit of the gate positive voltage is limited by the height of the Schottky barrier. That is, the gate voltage range can be enlarged as compared with the HEMT device of Schottky type. As a result, a drain current can be increased. Additionally, a gate junction is substantially an MIS junction, and therefore the leakage current is reduced in both cases where the gate bias is positive and negative.

From another viewpoint, it is considered that this embodiment achieves an HEMT device of normally-off operation type having excellent characteristics without performing a troublesome step of forming a recess gate structure. This does not exclude that the source electrode 7 and the drain electrode 8 have recess structures.

Furthermore, the main insulating layer 6a made of silicon nitride is formed continuously from the layer (the sub insulating layer 6b or the barrier layer 5) located immediately below. Therefore, a reduction in drain-current collapse, and the like, are expected.

As thus far described, in this embodiment, a barrier layer is formed with a thickness of 3 nm or less so as to satisfy the above-mentioned composition range, and a (main) insulating layer made of silicon nitride is formed with a thickness of 3 nm or less at a formation temperature of 750° C. to 850° C. Thereby, an epitaxial substrate having a high two-dimensional electron concentration and a low sheet resistance is achieved.

By using such an epitaxial substrate, an HEMT device of normally-off operation type having a low on-resistance, in which the gate threshold voltage has a positive value and the upper limit of the gate voltage is high, can be achieved without performing a troublesome step of forming a recess gate structure.

EXAMPLES

Example 1

In this example, as the epitaxial substrate 10 according to the above-described embodiment, 36 types of epitaxial substrates 10 were prepared which were common to one another in terms of the compositions of the channel layer 3 and the barrier layer 5 and different from one another in terms of the combination of four preparation conditions, namely, the thickness of the barrier layer 5, the thickness of the main insulating layer 6a, the formation temperature (the temperature of the susceptor) at which the main insulating layer 6a was formed, and the thickness of the sub insulating layer 6b. Then, each of the types of epitaxial substrates 10 thus obtained was measured for its sheet resistance. Moreover, each epitaxial substrate 10 was used to prepare an HEMT device 20, and its threshold voltage, contact resistance, and gate leakage current were evaluated. Table 1 shows a list of formation conditions specific to and measurement results of specimens (specimen Nos. a-1 to a-18) in which the channel layer 3 was made of GaN and the barrier layer 5 was made of $In_{0.23}Al_{0.77}N$. Table 2 shows a list of formation conditions specific to and measurement results of specimens (specimen Nos. b-1 to b-18) in which the channel layer 3 is made of $Al_{0.2}Ga_{0.8}N$ and the barrier layer 5 is made of $In_{0.154}Al_{0.646}Ga_{0.2}N$.

Firstly, the epitaxial substrate 10 was prepared. At that time, until the formation of the barrier layer 5, all the epitaxial substrates 10 were prepared under the same conditions except the above-mentioned conditions.

To be specific, firstly, a plurality of (0001)-oriented 6H—SiC substrates having a diameter of two inches were prepared as the base substrate 1. The thickness thereof was 300 μm. Each of the substrates was placed in a reactor of an MOCVD apparatus, and the inside of the reactor was vacuumed. Then, the pressure in the reactor was set to be 30 kPa, and an atmosphere in a hydrogen/nitrogen mixed flow state was created. Then, the susceptor was heated, to thereby raise the temperature of the base substrate 1.

After the temperature of the susceptor reached 1050° C., a TMA bubbling gas and an ammonia gas were introduced into the reactor, and an AlN layer having a thickness of 200 nm was formed as the buffer layer.

Then, the temperature of the susceptor was set to be a predetermined temperature, a TMG bubbling gas serving as the metal organic source gas and an ammonia gas were introduced into the reactor with a predetermined flow ratio. Thus, a GaN layer or $Al_{0.2}Ga_{0.8}N$ layer serving as the channel layer 3 was formed with a thickness of 2 μm).

After the formation of the channel layer 3, the pressure in the reactor was set to be 10 kPa, and then a TMA bubbling gas and an ammonia gas were introduced into the reactor. Thus, an AlN layer having a thickness of 1 nm was formed as the spacer layer 4.

After the formation of the spacer layer 4, the barrier layer 5 was then formed. The temperature of the susceptor was set in accordance with the composition of the barrier layer. The thickness of the barrier layer 5 was varied in four levels of 2 nm, 2.5 nm, 3 nm, and 4 nm.

After the formation of the barrier layer 5, in part of the specimens, an AlN layer serving as the sub insulating layer 6b was formed. The thickness of the sub insulating layer 6b was varied in five levels of 0 nm (corresponding to a case where no sub insulating layer 6b is provided), 1 nm, 2 nm, 2.5 nm, and 3 nm. In any of the cases, the temperature of the susceptor was 1050° C.

Then, in the specimens with the exception of a part of them, a silicon nitride layer serving as the main insulating layer 6a was formed. The thickness of the main insulating layer 6a was varied in six levels of 0 nm (corresponding to a case where no main insulating layer 6a is provided), 1.5 nm, 2 nm, 2.5 nm, 3 nm, and 4 nm. The temperature of the susceptor was varied in five levels of 750° C., 800° C., 850° C., 900° C., and 1000° C.

After all the intended layers were formed, the temperature of the susceptor was lowered to the vicinity of a room temperature, and the inside of the reactor was returned to the atmospheric pressure. Then, the prepared epitaxial substrates 10 were taken out. Through the above-described procedures, each of the epitaxial substrates 10 was obtained.

The obtained epitaxial substrates 10 were measured for their sheet resistances by the four-terminal method. The results thus obtained were shown in Table 1 and Table 2.

Then, through a photolithography process and a vacuum vapor deposition process, an electrode pattern made of Ti/Al/Ni/Au (with film thicknesses of 25/75/15/100 nm, respectively) was formed on an upper surface of the main insulating layer 6a in expected formation positions where the source electrode 7 and the drain electrode 8 were to be formed. Then, a heat treatment was performed in nitrogen for 30 seconds at 800° C.

Then, through a photolithography process and a vacuum vapor deposition process, a pattern of the gate electrode 9 made of Ni/Au (with a film thickness of 6 nm/12 nm) was formed on the upper surface of the main insulating layer 6a in an expected formation position where the gate electrode 9 was to be formed. The gate electrode 9 was formed such that its portion bonded to the main insulating layer 6a has a size of 1 mm×1 mm.

Finally, a resultant was singulated into chips, thus obtaining a large number of HEMT devices 20.

Die bonding and wire bonding were performed on the obtained HEMT devices 20, and then, by the Hall effect method, the threshold voltage, the contact resistance, and the gate leakage current caused upon application of −100V, were measured. Results thereof are shown in Table 1 and Table 2.

TABLE 1

| No. | Film Thickness of Barrier Layer (nm) | Main Insulating Layer Film Thickness (nm) | Main Insulating Layer Formation Temperature (° C.) | Film Thickness of Sub Insulating Layer (nm) | Sheet Resistance (Ω·sq) | Threshold Voltage (V) | Contact Resistance (Ω·cm$^2$) | Gate Leakage Current (when −100 V was applied) (A/mm) | Evaluation |
|---|---|---|---|---|---|---|---|---|---|
| a-1 | 2 | 0 | — | 0 | 860 | 1.20 | 7.5E−06 | 1.2E−04 | OUTSIDE SCOPE OF PRESENT INVENTION |
| a-2 | 2 | 1.5 | 800 | 0 | 420 | 0.75 | 7.2E−06 | 3.5E−08 | |
| a-3 | 2 | 2 | 800 | 0 | 414 | 0.64 | 6.3E−06 | 4.0E−09 | |
| a-4 | 2 | 2 | 800 | 0 | 413 | 0.64 | 5.5E−06 | 4.0E−09 | |
| a-5 | 2 | 2.5 | 800 | 0 | 425 | 0.50 | 6.0E−06 | 1.6E−10 | |
| a-6 | 2 | 3 | 800 | 0 | 416 | 0.25 | 8.0E−06 | 5.6E−10 | |
| a-7 | 2 | 4 | 800 | 0 | 418 | −0.16 | 6.5E−06 | 4.3E−09 | OUTSIDE SCOPE OF PRESENT INVENTION |
| a-8 | 2 | 2 | 750 | 0 | 418 | 0.65 | 5.0E−06 | 4.2E−08 | |
| a-9 | 2 | 2 | 850 | 0 | 416 | 0.64 | 6.0E−06 | 3.5E−09 | |
| a-10 | 2 | 2 | 900 | 0 | 416 | 0.60 | 1.2E−04 | 2.4E−09 | OUTSIDE SCOPE OF PRESENT INVENTION |
| a-11 | 2 | 2 | 1000 | 0 | 419 | 0.60 | 5.5E−04 | 1.2E−09 | OUTSIDE SCOPE OF PRESENT INVENTION |
| a-12 | 2.5 | 2 | 800 | 0 | 420 | 0.48 | 5.8E−06 | 4.2E−09 | |
| a-13 | 3 | 2 | 800 | 0 | 418 | 0.31 | 7.0E−06 | 5.0E−09 | |

TABLE 1-continued

| No. | Film Thickness of Barrier Layer (nm) | Main Insulating Layer Film Thickness (nm) | Main Insulating Layer Formation Temperature (° C.) | Film Thickness of Sub Insulating Layer (nm) | Sheet Resistance (Ω · sq) | Threshold Voltage (V) | Contact Resistance (Ω · cm$^2$) | Gate Leakage Current (when −100 V was applied) (A/mm) | Evaluation |
|---|---|---|---|---|---|---|---|---|---|
| a-14 | 4 | 2 | 800 | 0 | 422 | −0.20 | 7.0E−06 | 4.4E−09 | OUTSIDE SCOPE OF PRESENT INVENTION |
| a-15 | 2 | 2 | 800 | 1 | 421 | 0.45 | 7.2E−06 | 4.0E−10 | |
| a-16 | 2 | 2 | 800 | 2 | 418 | 0.30 | 9.3E−06 | 2.0E−10 | |
| a-17 | 2 | 2 | 800 | 2.5 | 416 | 0.10 | 1.2E−05 | 1.5E−10 | |
| a-18 | 2 | 2 | 800 | 3 | 419 | −0.40 | 6.5E−04 | 1.2E−10 | OUTSIDE SCOPE OF PRESENT INVENTION |

TABLE 2

| No. | Film Thickness of Barrier Layer (nm) | Main Insulating Layer Film Thickness (nm) | Main Insulating Layer Formation Temperature (° C.) | Film Thickness of Sub Insulating Layer (nm) | Sheet Resistance (Ω · sq) | Threshold Voltage (V) | Contact Resistance (Ω · cm$^2$) | Gate Leakage Current (when −100 V was applied) (A/mm) | Evaluation |
|---|---|---|---|---|---|---|---|---|---|
| b-1 | 2 | 0 | — | 0 | 980 | 1.44 | 8.0E−06 | 1.1E−04 | OUTSIDE SCOPE OF PRESENT INVENTION |
| b-2 | 2 | 1.5 | 800 | 0 | 580 | 0.99 | 5.0E−06 | 3.3E−08 | |
| b-3 | 2 | 2 | 800 | 0 | 574 | 0.89 | 8.8E−06 | 3.8E−09 | |
| b-4 | 2 | 2 | 800 | 0 | 575 | 0.88 | 6.0E−06 | 3.8E−09 | |
| b-5 | 2 | 2.5 | 800 | 0 | 565 | 0.74 | 7.0E−06 | 1.5E−10 | |
| b-6 | 2 | 3 | 800 | 0 | 574 | 0.49 | 8.0E−06 | 5.3E−10 | |
| b-7 | 2 | 4 | 800 | 0 | 574 | −0.03 | 8.5E−06 | 4.1E−09 | OUTSIDE SCOPE OF PRESENT INVENTION |
| b-8 | 2 | 2 | 750 | 0 | 571 | 0.89 | 8.5E−06 | 4.0E−08 | |
| b-9 | 2 | 2 | 850 | 0 | 572 | 0.88 | 6.0E−06 | 3.3E−09 | |
| b-10 | 2 | 2 | 900 | 0 | 573 | 0.84 | 2.4E−04 | 2.3E−09 | OUTSIDE SCOPE OF PRESENT INVENTION |
| b-11 | 2 | 2 | 1000 | 0 | 575 | 0.84 | 7.5E−04 | 1.1E−09 | OUTSIDE SCOPE OF PRESENT INVENTION |
| b-12 | 2.5 | 2 | 800 | 0 | 573 | 0.72 | 9.0E−06 | 4.0E−09 | |
| b-13 | 3 | 2 | 800 | 0 | 570 | 0.55 | 8.0E−06 | 4.8E−09 | |
| b-14 | 4 | 2 | 800 | 0 | 580 | −0.02 | 9.0E−06 | 4.2E−09 | OUISIDE SCOPE OF PRESENT INVENTION |
| b-15 | 2 | 2 | 800 | 1 | 579 | 0.60 | 8.0E−06 | 7.8E−10 | |
| b-16 | 2 | 2 | 800 | 2 | 581 | 0.25 | 9.0E−06 | 5.0E−10 | |
| b-17 | 2 | 2 | 800 | 2.5 | 572 | 0.05 | 1.4E−05 | 3.4E−10 | |
| b-18 | 2 | 2 | 800 | 3 | 577 | −0.25 | 8.0E−04 | 1.5E−10 | OUTSIDE SCOPE OF PRESENT INVENTION |

The results shown in Table 1 and Table 2 reveal that the sheet resistances of the specimens (a-2 to a-18, b-2 to b-18) including the main insulating layer 6a were reduced to about ½ of the sheet resistances of the specimens (a-1, b-1) not including the main insulating layer 6a. This indicates that providing the main insulating layer 6a is effective in a reduction in the sheet resistance of the epitaxial substrate 10.

Moreover, the gate leakage currents of the specimens including the main insulating layer 6a were reduced to about 1/10000 to 1/1000000 of the gate leakage currents of the specimens not including the main insulating layer 6a. This indicates that preparing the HEMT device 20 by using the epitaxial substrate 10 that includes the main insulating layer 6a is highly effective in a reduction in the gate leakage current of the HEMT device 20.

Focusing on the relationship of the characteristics of the HEMT device 20 relative to the thicknesses of the barrier layer 5 and the main insulating layer 6a, there is a tendency that, as each of the thicknesses increases, the threshold voltage decreases. When the thickness was 3 nm or less, the threshold voltage had a positive value, while only the specimens (a-7, a-14, b-7, b-14) with a thickness of 4 nm had negative threshold voltages. This result indicates that, in order to achieve the HEMT device 20 of normally-off operation type, it is necessary that both of the thicknesses of the barrier layer 5 and the main insulating layer 6a are set to be 3 nm or less. When the threshold voltage is in a positive range, there is a tendency that, as the thickness of the main insulating layer 6a increases, the gate leakage current decreases.

Focusing on the relationship of the characteristics of the HEMT device 20 and the formation temperature at which the main insulating layer 6a was formed, the contact resistances of the specimens (a-10, a-11, b-10, b-11) having a formation temperature of 900° C. or more were about two orders higher than the contact resistances of the other specimens having a formation temperature of 800° C. or less. This result indicates that lowering the formation temperature to thereby form the main insulating layer 6a as a layer having a lower crystallinity than that of an ordinary insulating layer is effective in a reduction in the contact resistance.

Moreover, focusing on the specimens (a-15 to a-18, b-15 to b-18) including the sub insulating layer 6b, the gate leakage currents thereof were lower than the gate leakage currents of the specimens (a-3, a-4, b-3, b-4) not including the sub insulating layer 6b in which the barrier layer 5 and the main insulating layer 6a were prepared under the same preparation conditions. However, in the specimens (a-18, b-18) in which the sub insulating layer 6b had a thickness of 4 nm, the threshold voltages were negative and the contact resistances were increased. This result means that providing the sub insulating layer 6b with a thickness of 3 nm or less is effective in a reduction in the gate leakage current of the HEMT device 20. Here, there is a tendency that, as the thickness of the sub insulating layer 6b increases, the threshold voltage decreases. Therefore, in order to achieve the normally-off operation without fail, it would be preferable that the thickness of the sub insulating layer 6b is 2 nm or less.

Example 2

In this example, as the epitaxial substrate 10 according to the above-described embodiment, 28 types of epitaxial substrates 10 were prepared under the same conditions as in the example 1 except that the composition of the channel layer 3 was varied in four levels and the composition of the barrier layer 5 was varied in seven levels. Then, each of the types of epitaxial substrates 10 thus obtained was measured for its sheet resistance. Moreover, each epitaxial substrate 10 was used to prepare an HEMT device 20, and its threshold voltage, contact resistance, and gate leakage current were evaluated. In all the specimens (specimen Nos. c-1 to c-18), the thickness of the barrier layer 5 was 2 nm. The thickness of the main insulating layer 6a was 2 nm and the formation temperature (the temperature of the susceptor) at which the main insulating layer 6a was formed was 800° C. The sub insulating layer 6b was not formed. Table 3 shows a list of formation conditions specific to and measurement results of the specimens.

In the ternary phase diagrams for three components of InN, AlN, and GaN shown in FIGS. 2 to 5, the compositions of the barrier layers 5 of the respective specimens were plotted with circles. That is, the compositions of the channel layers 3 and the barrier layers 5 of all the specimens were including in a range that is enclosed by four straight lines represented by the expressions (1) to (4).

TABLE 3

| No. | Composition of Channel Layer | Composition of Barrier Layer | | | Sheet Resistance ($\Omega \cdot$ sq) | Threshold Voltage (V) | Contact Resistance ($\Omega \cdot cm^2$) | Gate Leakage Current (when −100 V was applied) (A/mm) |
|---|---|---|---|---|---|---|---|---|
| | | $In_{x2}$ | $Al_{y2}$ | $Ga_{z2}$ | | | | |
| c-1 | GaN | 0.25 | 0.75 | 0 | 591 | 0.99 | 9.0E−06 | 5.0E−09 |
| c-2 | | 0.23 | 0.77 | 0 | 414 | 0.64 | 6.3E−06 | 4.0E−09 |
| c-3 | | 0.21 | 0.79 | 0 | 301 | 0.30 | 4.6E−06 | 3.5E−09 |
| c-4 | | 0.19 | 0.61 | 0.2 | 607 | 1.00 | 9.3E−06 | 5.4E−09 |
| c-5 | | 0.16 | 0.64 | 0.2 | 371 | 0.53 | 5.7E−06 | 6.5E−09 |
| c-6 | | 0.11 | 0.49 | 0.4 | 514 | 0.82 | 7.8E−06 | 5.5E−09 |
| c-7 | | 0.08 | 0.52 | 0.4 | 325 | 0.39 | 5.0E−06 | 5.8E−09 |
| c-8 | $Al_{0.1}Ga_{0.9}N$ | 0.232 | 0.768 | 0 | 546 | 0.93 | 8.3E−06 | 8.0E−09 |
| c-9 | | 0.212 | 0.788 | 0 | 391 | 0.59 | 6.0E−06 | 5.1E−09 |
| c-10 | | 0.192 | 0.808 | 0 | 288 | 0.24 | 4.4E−06 | 6.0E−09 |
| c-11 | | 0.172 | 0.628 | 0.2 | 558 | 0.95 | 8.5E−06 | 5.5E−09 |
| c-12 | | 0.142 | 0.658 | 0.2 | 352 | 0.48 | 5.4E−06 | 4.5E−09 |
| c-13 | | 0.092 | 0.508 | 0.4 | 478 | 0.76 | 7.3E−06 | 7.3E−09 |
| c-14 | | 0.062 | 0.538 | 0.4 | 310 | 0.34 | 4.7E−06 | 5.5E−09 |
| c-15 | $Al_{0.2}Ga_{0.8}N$ | 0.214 | 0.786 | 0 | 561 | 0.88 | 8.6E−06 | 6.0E−09 |
| c-16 | | 0.194 | 0.806 | 0 | 370 | 0.53 | 5.7E−06 | 5.2E−09 |
| c-17 | | 0.174 | 0.826 | 0 | 277 | 0.19 | 4.2E−05 | 6.3E−09 |
| c-18 | | 0.154 | 0.646 | 0.2 | 574 | 0.89 | 8.8E−06 | 3.8E−09 |
| c-19 | | 0.124 | 0.676 | 0.2 | 335 | 0.43 | 5.1E−06 | 4.5E−08 |
| c-20 | | 0.074 | 0.526 | 0.4 | 446 | 0.71 | 6.8E−06 | 7.1E−09 |
| c-21 | | 0.044 | 0.556 | 0.4 | 296 | 0.28 | 4.5E−06 | 6.1E−09 |
| c-22 | $Al_{0.3}Ga_{0.7}N$ | 0.196 | 0.804 | 0 | 520 | 0.83 | 7.9E−06 | 5.4E−09 |
| c-23 | | 0.176 | 0.824 | 0 | 352 | 0.48 | 5.4E−06 | 6.3E−09 |
| c-24 | | 0.156 | 0.844 | 0 | 266 | 0.13 | 4.1E−06 | 6.6E−09 |
| c-25 | | 0.136 | 0.664 | 0.2 | 531 | 0.84 | 8.1E−06 | 7.2E−08 |
| c-26 | | 0.106 | 0.694 | 0.2 | 319 | 0.37 | 4.9E−06 | 4.8E−09 |
| c-27 | | 0.056 | 0.544 | 0.4 | 419 | 0.65 | 6.4E−06 | 4.4E−09 |
| c-28 | | 0.026 | 0.574 | 0.4 | 284 | 0.22 | 4.3E−06 | 5.6E−09 |

The results shown in Table 3 indicate that preparing an epitaxial substrate by selecting the compositions of the channel layer 3 and the barrier layer 5 from the composition ranges represented by the expressions (1) to (4) can achieve an epitaxial substrate having a low sheet resistance, and that preparing an HEMT device by using this epitaxial substrate as described in the embodiment above can achieve an HEMT device of normally-off operation type having a low on-resistance in which the gate threshold voltage has a positive value and the upper limit of the gate voltage is high.

The invention claimed is:
1. An epitaxial substrate for semiconductor device, comprising a base substrate;
a channel layer made of a first group-III nitride having a composition of $In_{x1}Al_{y1}Ga_{z1}N$ (x1+y1+z1=1) that contains at least Al and Ga; and
a barrier layer made of a second group-III nitride having a composition of $In_{x2}Al_{y2}Ga_{z2}N$ (x2+y2+z2=1) that contains at least In and Al,
wherein
the composition of said first group-III nitride is in a range determined by x1=0 and 0≤y1≤0.3,
the composition of said second group-III nitride is, in a ternary phase diagram for InN, AlN, and GaN, in a range that is enclosed by straight lines represented by the following expressions and that is determined in accordance with the composition of said first group-III nitride,
said barrier layer has a thickness of 3 nm or less,
a low-crystallinity insulating layer is formed on said barrier layer, said low-crystallinity insulating layer being made of silicon nitride and having a thickness of 3 nm or less, $$x2 = \frac{y2 - (0.27 + 0.5yl)}{1.78} = -\frac{z2 - (0.73 - 0.5yl)}{2.78}$$
$$x2 = \frac{y2 - (0.4 + 0.6yl)}{1.78} = -\frac{z2 - (0.6 - 0.6yl)}{2.78}$$

z2=0.4 z2=0.

2. The epitaxial substrate for semiconductor device according to claim 1, further comprising:
a sub insulating layer provided between said barrier layer and said low-crystallinity insulating layer, said sub insulating layer being made of a group-III nitride with insulating properties and having a thickness of 2.5 nm or less.

3. The epitaxial substrate for semiconductor device according to claim 2, wherein
said sub insulating layer is made of AlN.

4. The epitaxial substrate for semiconductor device according to claim 1, further comprising:
a spacer layer provided between said channel layer and said barrier layer, said spacer layer being made of a third group-III nitride having a composition of $In_{x3}Al_{y3}Ga_{z3}N$ (x3+y3+z3=1) that contains at least Al and that has higher band gap energy than that of said barrier layer, wherein
a total thickness of said spacer layer and said barrier layer is 5 nm or less.

5. The epitaxial substrate for semiconductor device according to claim 4, wherein
said spacer layer is made of AlN.

6. The epitaxial substrate for semiconductor device according to claim 2, further comprising:
a spacer layer provided between said channel layer and said barrier layer, said spacer layer being made of a third group-III nitride having a composition of $In_{x3}Al_{y3}Ga_{z3}N$ (x3+y3+z3=1) that contains at least Al and that has higher band gap energy than that of said barrier layer, wherein
a total thickness of said spacer layer and said barrier layer is 5 nm or less.

7. The epitaxial substrate for semiconductor device according to claim 6, wherein
said spacer layer is made of AlN.

8. A semiconductor device, comprising:
a base substrate;
a channel layer made of a first group-III nitride having a composition of $In_{x1}Al_{y1}Ga_{z1}N$ (x1+y1+z1=1) that contains at least Al and Ga; and
a barrier layer made of a second group-III nitride having a composition of $In_{x2}Al_{y2}Ga_{z2}N$ (x2+y2+z2=1) that contains at least In and Al,
wherein
the composition of said first group-III nitride is in a range determined by x1=0 and 0≤y1≤0.3,
the composition of said second group-III nitride is, in a ternary phase diagram for InN, AlN, and GaN, in a range that is enclosed by straight lines represented by the following expressions and that is determined in accordance with the composition of said first group-III nitride,
said barrier layer has a thickness of 3 nm or less,
a low-crystallinity insulating layer is formed on said barrier layer, said low-crystallinity insulating layer being made of silicon nitride and having a thickness of 3 nm or less,
a source electrode and a drain electrode are formed on said low-crystallinity insulating layer with an ohmic junction, and
a gate electrode is formed on said low-crystallinity insulating layer with a Schottky junction, $$x2 = \frac{y2 - (0.27 + 0.5yl)}{1.78} = -\frac{z2 - (0.73 - 0.5yl)}{2.78}$$
$$x2 = \frac{y2 - (0.4 + 0.6yl)}{1.78} = -\frac{z2 - (0.6 - 0.6yl)}{2.78}$$

z2=0.4 z2=0.

9. A method of manufacturing a epitaxial substrate for semiconductor device, said method comprising:
a channel layer formation step of epitaxially forming a channel layer on a base substrate, said channel layer being made of a first group-III nitride having a composition of $In_{x1}Al_{y1}Ga_{z1}N$ (x1+y1+z1=1) that contains at least Al and Ga;
a barrier layer formation step of epitaxially forming a barrier layer on said channel layer, said barrier layer being made of a second group-III nitride having a composition of $In_{x2}Al_{y2}Ga_{z2}N$ (x2+y2+z2=1) that contains at least In and Al; and
a main insulating layer formation step of forming a main insulating layer on said barrier layer, said main insulating layer being made of silicon nitride,
wherein
in said channel layer formation step, the composition of said first group-III nitride is selected from a range determined by x1=0 and 0≤y1≤0.3,
in said barrier layer formation step,
the composition of said second group-III nitride is selected from a range that is enclosed by straight lines represented by the following expressions and that is determined in accordance with the composition of said first group-III nitride in a ternary phase diagram for InN, AlN, and GaN, and
said barrier layer is formed with a thickness of 3 nm or less, in said main insulating layer formation step, said main insulating layer is formed with a thickness of 3 nm or less at a formation temperature of 750° C. or more and 850° C. or less, $$x2 = \frac{y2 - (0.27 + 0.5yl)}{1.78} = -\frac{z2 - (0.73 - 0.5yl)}{2.78}$$

$$x2 = \frac{y2 - (0.4 + 0.6yl)}{1.78} = -\frac{z2 - (0.6 - 0.6yl)}{2.78}$$

z2=0.4 z2=0.

10. The method of manufacturing an epitaxial substrate for semiconductor device according to claim 9, further comprising:
a sub insulating layer formation step of forming a sub insulating layer on said barrier layer, said sub insulating layer being made of a group-III nitride with insulating properties and having a thickness of 2.5 nm or less, wherein
said main insulating layer is formed on said sub insulating layer.

11. The method of manufacturing an epitaxial substrate for semiconductor device according to claim 10, wherein
said sub insulating layer is made of AlN.

12. The method of manufacturing an epitaxial substrate for semiconductor device according to claim 9, further comprising:
a spacer layer formation step of forming a spacer layer on said channel layer, said spacer layer being made of a third group-III nitride having a composition of $In_{x3}Al_{y3}Ga_{z3}N$ (x3+y3+z3=1) that contains at least Al and that has higher band gap energy than that of said barrier layer, wherein
said barrier layer is formed on said spacer layer.

13. The method of manufacturing an epitaxial substrate for semiconductor device according to claim 12, wherein
said spacer layer is made of AlN.

14. The method of manufacturing an epitaxial substrate for semiconductor device according to claim 9, wherein
a temperature T1(° C.) at which said channel layer is formed is determined within a range of 950° C.≤T1≤1250° C.,
a temperature T2(° C.) at which said barrier layer is formed is determined within a range of 800−667·x2(° C.)≤T2≤860−667·x2(° C.) and 600° C.≤T2≤850° C., said range being determined in accordance with an InN mole fraction x2 in said second group-III nitride.

15. The method of manufacturing an epitaxial substrate for semiconductor device according to claim 10, further comprising:
a spacer layer formation step of forming a spacer layer on said channel layer, said spacer layer being made of a third group-III nitride having a composition of $In_{x3}Al_{y3}Ga_{z3}N$ (x3+y3+z3=1) that contains at least Al and that has higher band gap energy than that of said barrier layer, wherein
said barrier layer is formed on said spacer layer.

16. The method of manufacturing an epitaxial substrate for semiconductor device according to claim 15, wherein
said spacer layer is made of AlN.

17. The method of manufacturing an epitaxial substrate for semiconductor device according to claim 10, wherein
a temperature T1(° C.) at which said channel layer is formed is determined within a range of 950° C.≤T1≤1250° C.,
a temperature T2(° C.) at which said barrier layer is formed is determined within a range of 800−667·x2(° C.)≤T2≤860−667·x2(° C.) and 600° C.≤T2≤850° C., said range being determined in accordance with an InN mole fraction x2 in said second group-III nitride.

18. A method of manufacturing a semiconductor device, said method comprising the steps of:
preparing an epitaxial substrate with following steps,
a channel layer formation step of epitaxially forming a channel layer on a base substrate, said channel layer being made of a first group-III nitride having a composition of $In_{x1}Al_{y1}Ga_{z1}N$ (x1+y1+z1=1) that contains at least Al and Ga,
a barrier layer formation step of epitaxially forming a barrier layer on said channel layer, said barrier layer being made of a second group-III nitride having a composition of $In_{x2}Al_{y2}Ga_{z2}N$ (x2+y2+z2=1) that contains at least In and Al, and
a main insulating layer formation step of forming a main insulating layer on said barrier layer, said main insulating layer being made of silicon nitride,
wherein
in said channel layer formation step, the composition of said first group-III nitride is selected from a range determined by x1=0 and 0≤y1≤0.3,
in said barrier layer formation step, the composition of said second group-III nitride is selected from a range that is enclosed by straight lines represented by the following expressions and that is determined in accordance with the composition of said first group-III nitride in a ternary phase diagram for InN, AlN, and GaN, and
said barrier layer is formed with a thickness of 3 nm or less,
in said main insulating layer formation step, said main insulating layer is formed with a thickness of 3 nm or less at a formation temperature of 750° C. or more and 850° C. or less;
forming a source electrode and a drain electrode on said main insulating layer of said epitaxial substrate, with an ohmic junction;
performing a heat treatment on said epitaxial substrate having said source electrode and said drain electrode formed thereon; and
forming a gate electrode on said main insulating layer, with a Schottky junction, $$x2 = \frac{y2 - (0.27 + 0.5yl)}{1.78} = -\frac{z2 - (0.73 - 0.5yl)}{2.78}$$

$$x2 = \frac{y2 - (0.4 + 0.6yl)}{1.78} = -\frac{z2 - (0.6 - 0.6yl)}{2.78}$$

z2=0.4 z2=0.

* * * * *